United States Patent
Vieten

(10) Patent No.: US 10,621,874 B2
(45) Date of Patent: Apr. 14, 2020

(54) DEVICE ARRANGEMENT AND METHOD FOR IMPROVING THE DETECTION QUALITY OF GROUND SITUATION REPRESENTATION SYSTEMS AND TRAFFIC GUIDANCE OR TRAFFIC MANAGEMENT SYSTEMS

(71) Applicant: FRAPORT AG FRANKFURT AIRPORT SERVICES WORLDWIDE, Frankfurt (DE)

(72) Inventor: Bjoern Daniel Vieten, Nackenheim (DE)

(73) Assignee: FRAPORT AG FRANKFURT AIRPORT SERVICES WORLDWIDE, Frankfurt (DE)

( * ) Notice: Subject to any disclaimer, the term of this patent is extended or adjusted under 35 U.S.C. 154(b) by 0 days.

(21) Appl. No.: 16/062,166

(22) PCT Filed: Apr. 14, 2016

(86) PCT No.: PCT/EP2016/058162
§ 371 (c)(1),
(2) Date: Jun. 14, 2018

(87) PCT Pub. No.: WO2017/102102
PCT Pub. Date: Jun. 22, 2017

(65) Prior Publication Data
US 2018/0366009 A1     Dec. 20, 2018

(30) Foreign Application Priority Data
Dec. 15, 2015 (DE) ........................ 10 2015 121 841

(51) Int. Cl.
*G08G 1/00* (2006.01)
*G08G 5/00* (2006.01)
(Continued)

(52) U.S. Cl.
CPC .......... *G08G 5/0026* (2013.01); *B64F 1/002* (2013.01); *G08G 5/0013* (2013.01); *G08G 5/065* (2013.01); *G01R 33/02* (2013.01); *G08G 5/025* (2013.01)

(58) Field of Classification Search
CPC ....... B64F 1/002; G01R 33/02; G08G 5/0013; G08G 5/0026; G08G 5/065
(Continued)

(56) References Cited

U.S. PATENT DOCUMENTS 6,573,840 B1 *  6/2003  Norman ............... G08G 5/0026
                                                                          340/642
9,530,323 B1 * 12/2016  Maji ...................... G08G 5/0021
(Continued)

FOREIGN PATENT DOCUMENTS

DE     102012014303 A1    11/2012
DE     102013102073 A1     9/2014
(Continued)

*Primary Examiner* — Naomi J Small
(74) *Attorney, Agent, or Firm* — McNees Wallace & Nurick LLC

(57) ABSTRACT

A device arrangement for improving the detection quality of ground situation representation systems and traffic guidance or traffic management systems, in particular at an airport, comprises at least the following components interacting with each other: a lighting unit having at least one controllable lamp, and an earth's magnetic field sensor for determining the position, direction of movement, orientation, and/or speed of an object.

29 Claims, 1 Drawing Sheet

(51) Int. Cl.
  *G08G 5/06* (2006.01)
  *B64F 1/00* (2006.01)
  *G08G 5/02* (2006.01)
  *G01R 33/02* (2006.01)

(58) Field of Classification Search
  USPC .......................................................... 340/928
  See application file for complete search history.

(56) References Cited

U.S. PATENT DOCUMENTS

| | | | | |
|---|---|---|---|---|
| 2005/0203676 A1* | 9/2005 | Sandell | ................ | G08G 5/0013 701/3 |
| 2006/0007035 A1 | 1/2006 | Corrigan | | |
| 2006/0202864 A1* | 9/2006 | Pirschel | .................... | B64F 1/18 340/945 |
| 2008/0059273 A1* | 3/2008 | Miller | .................... | G06Q 10/04 705/7.31 |
| 2010/0231721 A1* | 9/2010 | Meloche | ................ | G08G 5/065 348/159 |
| 2010/0286900 A1* | 11/2010 | Depape | ................ | G08G 5/0008 701/120 |
| 2013/0265187 A1* | 10/2013 | Hall | ...................... | G01S 13/9303 342/37 |
| 2016/0041305 A1* | 2/2016 | Stulken | ................... | G01W 1/10 340/977 |
| 2016/0159497 A1* | 6/2016 | Zhou | ...................... | B64F 1/227 307/9.1 |
| 2017/0052259 A1* | 2/2017 | Murphy | ................ | B64D 45/00 |

FOREIGN PATENT DOCUMENTS

| | | |
|---|---|---|
| EP | 1460605 A1 | 9/2004 |
| EP | 2199206 A1 | 6/2010 |
| WO | 2014135500 A1 | 9/2014 |

* cited by examiner

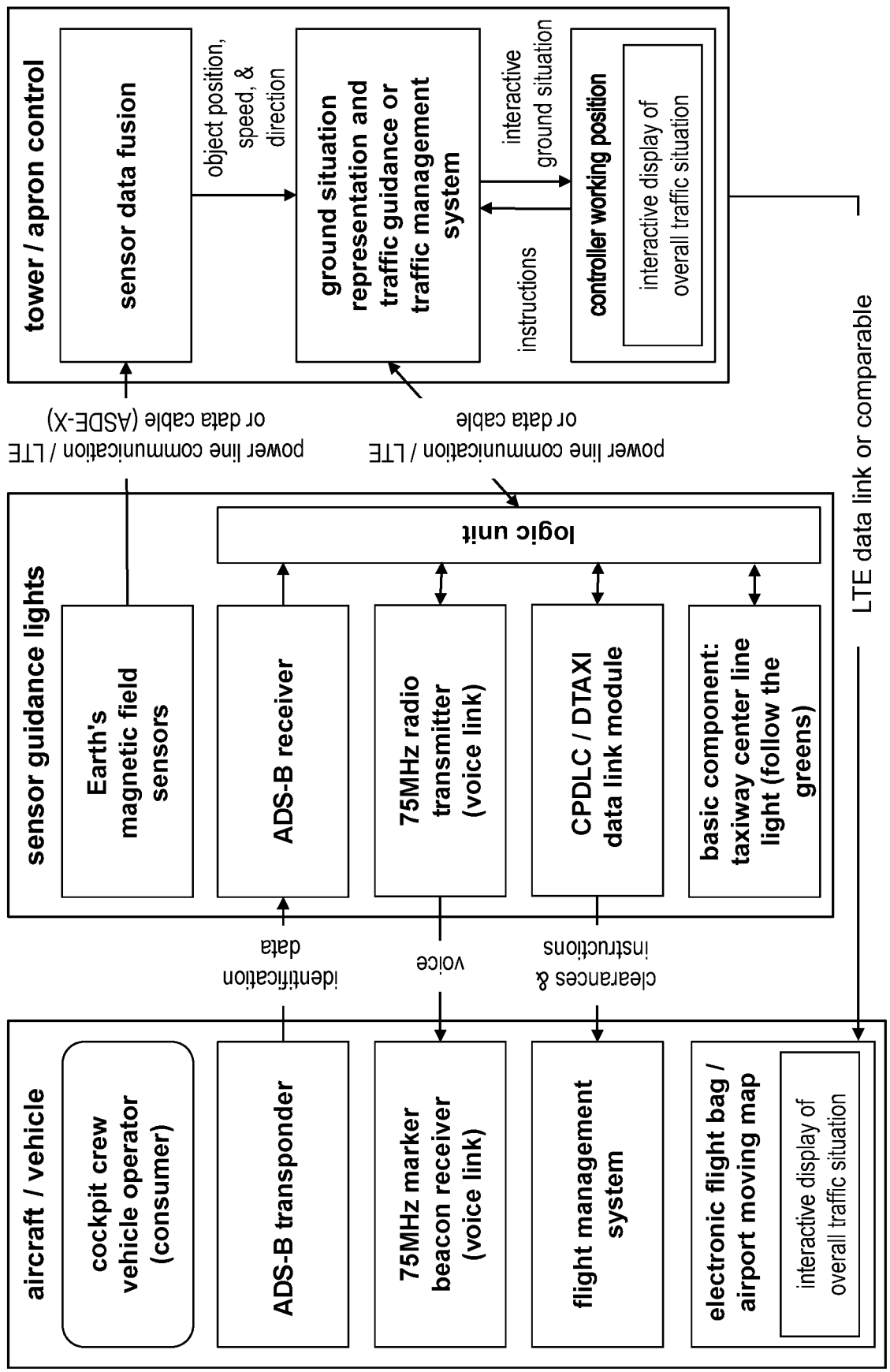

DEVICE ARRANGEMENT AND METHOD FOR IMPROVING THE DETECTION QUALITY OF GROUND SITUATION REPRESENTATION SYSTEMS AND TRAFFIC GUIDANCE OR TRAFFIC MANAGEMENT SYSTEMS

The invention relates to a device arrangement and a method for improving the detection quality of ground situation representation systems and traffic guidance or traffic management systems, in particular at an airport.

Today's ground situation representation systems and traffic guidance or traffic management systems, also referred to as A-SMGCS (Advanced Surface Movement Guidance and Control Systems) in the broadest sense or Surface Management Systems (SMAN), can for their part display or substantially influence an integrated Controller Working Position (CWP) for air traffic controllers or apron controllers. Therefore, in the following, "ground situation representation systems and traffic guidance or traffic management systems" is meant to refer to everything mentioned above and in the broadest sense to any tool to support air traffic controllers or apron controllers with or without the possibilities to carry out inputs. With regard to the detection of moving and static objects on the airport surface, such systems are mostly based on radar technology or on the combination of radar technology and a multilateration system, the individual sensor information of which is frequently combined in a sensor data fusion system to form an integrated situation image. These system networks are limited as regards their detection quality (position accuracy of objects, detection probability, directional accuracy, etc.). This applies in particular to the detection accuracy behind buildings and to structures with the nature of yards.

For new functionalities, such as the traffic planning, route generation and traffic guidance, among others, described in WO 2014/135500 A1, an improved detection quality is necessary in specific places. This applies regardless of whether optimum individual routes are automatically calculated with or without inclusion of the surrounding traffic and temporarily or permanently applicable restrictions. Furthermore, it is also irrelevant for this purpose which type of guidance is employed. Examples of this are, as set out in WO 2014/135500 A1, radiotelephony, field terminals such as, e.g., sequentially and individually switched taxiway center line lightings, or other external guidance systems, such as dynamic signage, or automated voice instructions on aircraft radio frequencies or frequencies of other receiving systems of the aircraft or vehicle, or also display systems that are mobile or integrated in aircraft or vehicles and have the display levels set out.

The object of the invention is to improve the detection quality of a ground situation representation system and traffic guidance or traffic management system, in particular at an airport, with regard to the above-mentioned requirements.

This object is achieved by a device arrangement having the features of claim 1 and by a method having the features of claim 14. Advantageous and expedient configurations of the device arrangement according to the invention and of the method according to the invention are indicated in the associated dependent claims.

The device arrangement according to the invention serves to improve the detection quality of ground situation representation systems and traffic guidance or traffic management systems, in particular at an airport, and comprises at least the following components interacting with each other: a lighting unit having at least one controllable lamp, and an earth's magnetic field sensor for determining the position, direction of movement, orientation, and/or speed of an object.

The invention is based on the finding that earth's magnetic field sensors constitute a suitable technology for improving the local detection quality. Earth's magnetic field sensors as are described in DE 10 2012 014303 A1 have not to date been made use of in ground situation representation systems and traffic guidance or traffic management systems or in comparable systems. The proposed integration of this technology makes implementation less complex than a separate concept.

The invention also provides a method for improving the detection quality of ground situation representation systems and traffic guidance or traffic management systems, in which at least one device arrangement of the kind described above is used.

Further features and advantages of the invention will be apparent from the description below and from the accompanying drawing, to which reference is made. In the drawing the single FIGURE shows a diagram of a preferred embodiment of the device arrangement according to the invention.

With reference to the single FIGURE, a device arrangement (referred to as "Sensor Guidance Lights" in the FIGURE) and a method for improving the detection quality of ground situation representation systems and traffic guidance or traffic management systems are presented. The embodiment described relates to the application of the arrangement and of the method at an airport with upstream sensor data fusion, integrated with individual automated multi-channel traffic guidance via various auditory and visual channels for aircraft, vehicles and vehicle groups. Multi-channel traffic guidance is understood to mean that selectively and depending on the availability of modules in a specific implementation in the field, also two or more synchronized guidance means transmit the same information in parallel, such as for example synthetic voice information in parallel to an appropriately switched center line lighting. Vehicle groups are, for example, tow trains or guided tow trains, but also formations such as for example in winter services.

The design of the device arrangement is modular, and the integration of the modules can mean both a physical integration in the sense of "spatially contained therein" and a technical integration in the sense of "directly connected thereto". The latter comprises in particular the mounting of modules or sub-modules such as antennas and sensors outside the lighting (hereinafter also referred to as light), e.g. in existing or milled gaps in the aircraft movement area or as add-on parts on above-ground installations.

To improve the local detection quality of objects, earth's magnetic field sensors are used in the device arrangement described here. Earth's magnetic field sensors can determine the position, direction of movement, object orientation, and speed of an object. These data can be combined into a vector and output in a proprietary format or—within the framework of the application preferred here—also in the ASTERIX format commonly used in aviation (All-purpose Structured EUROCONTROL Surveillance Information Exchange), for example in the CAT.10 or CAT.65 dialects. The data can then either be processed locally (in the device arrangement with the respective sensor), in a combination of cooperating devices (integrated lights), e.g. at an intersection, centrally by a sensor data fusion, or by modules of a ground situation representation and traffic guidance or traffic management system. Devices acting in combination and having integrated earth's magnetic field sensors can also be made use of here to obtain a simplified identification of the object. In this way, vehicles are distinguished from aircraft. In the case of vehicles, size classes can be identified, for example passenger cars or omnibuses, and in the case of aircraft, types of aircraft are identified.

As already mentioned at the outset, the integration of this technology makes implementation less complex than a detached concept. In the embodiment of the device arrangement described here, earth's magnetic field sensors are modularly integrated with components for individual automated traffic guidance and in devices already implemented on a large scale at commercial airports, in particular in so-called taxiway center line lightings (standard case) or also in taxiway marker lightings, stop bar lightings or holding position lightings, or also in systems for parking guidance and information systems such as display systems, traffic lighting systems and other guidance elements as well as dynamic or static signage.

The integration creates novel possibilities for utilization and automation in the field of taxiing traffic routing. Also, procedures requiring increased precision, such as the crossing of active runways, can be executed or processed even more safely. In addition, the integration provides access to the power supply network and, in the specific case of a center line lighting, also the necessary protection against pressure loads (roll-over capacity) as well as against other influences such as moisture. The use of the modular device arrangements is in no way limited and also potentially covers, among other things, the automated acquisition of time stamps such as in-blocks and off-blocks (recording of movement at the position or elsewhere and detection of standstill), but also the detection of the orientation of an aircraft, for example after pushback.

The detailed nature or configuration of the taxiway center line lighting with regard to the number of lamps (e.g., 1, 2 or 4), type of lamps (e.g., halogen or LED) and also the current use of the light (purely for orientation, or as a guide means in the context of a so-called "Follow the Greens", i.e. the individual sequential display of the cleared route segment by activated lights) are not of significant importance to the invention. Ideally, the lighting can be used as a guide means and has one, two, four, six or more lamps (e.g., three per direction and one each in red, yellow and green). In the case of orange and blue taxiing guide lines at an airport, these colors may alternatively or additionally also be contained in the lightings. The lighting selectively receives its control commands via power line communication from a lighting control system (or components/peripherals thereof), which in turn can be instructed by a ground situation representation and traffic guidance or traffic management system, other partner systems or by users, or via a separate communication cable such as, e.g., a local area network cable, or via relevant wireless communication standards such as GPRS, EDGE, UMTS, HSDPA, LTE, LTE Advanced, IEE 802.11a/h, IEE 802.11b/g, IEE 802.11n, IEE802.11ac, WiMAX and AeroMACS and their successors and others, and reports back its status via the same channel. Thus, there exists a data connection which is made use of within the scope of the invention for new types of data and to further systems than hitherto, as will be discussed in more detail below. In addition, it is possible to have the lighting controlled either by the central ground situation representation and traffic guidance or traffic management system for the signaling of instructions, or on the basis of the sensor data of the modularly integrated earth's magnetic field sensor, or on the basis of information from cooperating device arrangements (integrated lightings), e.g. at an intersection.

The device arrangement further contains a module of the type as is described in WO 2014/135500 A1, for the automated transmission of synthetic, partly synthetic or natural individual voice messages, which optionally are also in conformity with relevant standards, for example ICAO Doc 4444 ATMI/501, to be retrieved at: http://www.navcanada.ca/EN/media/Publications/ICAO-Doc-4444-EN.pdf, to receivers in cockpits of commercial aircraft and vehicles, which are supplied with instructions by a central system for ground situation representation and traffic guidance or traffic management system and/or can determine instructions locally or in combination with further identical or similar devices. In this connection, an individual aircraft radio frequency for each event or any other frequency, also including the Marker Beacon Receiver Frequency of aircraft, can be selectively served. In addition to instructions, automated information is also conceivable, such as, e.g., the indication of an imminent critical situation or particulars about relevant variables such as weather, surface quality or the like. The device arrangement may also be configured such that it transmits the same information to each participant in traffic, e.g. "Attention, Active Runway 300 Meters Ahead!". This may be triggered by the sensor system in the device arrangement, the coordination with further device arrangements in a group, as well as the central ground situation representation and traffic guidance or traffic management system. Should the device arrangement be connected via data link to central systems here, for example an Airport Operational Database (AODB) or the central ground situation representation and traffic guidance or traffic management system, or should a modular A-DSB receiver be installed for identification (see further below), the radio message may also comprise the identification of the taxiing movement, such as, e.g. "Lufthansa 123, Attention, Active Runway 300 Meters Ahead!". All in all, this also allows the device arrangement to be utilized as a protective mechanism against unauthorized intrusion into specific zones, such as, for example, including an unauthorized use of a runway.

If the integrated devices operate on aircraft radio frequencies, the use of local cells with limited transmission power is useful. In such a case, the integrated device arrangement can ensure, by transmitting the respective information via the data links described, that the status of the transmitter can be displayed at the controller working positions. This prevents a frequency from being occupied twice in this form of use. In addition, it is ensured by suitable means that the integrated device arrangement only carries out a radio transmission on an aircraft radio frequency when the latter is not currently occupied. For example, the integrated device arrangement can trigger a countdown, e.g. for three seconds, on the Human Machine Interface (HMI) of the controller working position, which visually announces the planned occupancy of the frequency in a local transmission area.

A receiver for ADS (Automatic Dependent Surveillance), for example ADS-B, which can be integrated modularly into the device arrangement, receives and processes identification information (including flight number, aircraft type, time signal, etc.) of aircraft and vehicles, which is usually transmitted non-directionally by them at 1,090 MHz. This is done either for local processing in an integrated device arrangement, for integration into the decision-making and management process of a group or network, for the purpose of forwarding to the central ground situation representation and traffic guidance or traffic management system or a sensor data fusion, or for a combination thereof. Should ADS be replaced by technologies such as Mode S Extended Squitter or VDL Mode 4 with or without TDMA, FLARM, or ECDIS as in shipping, or other standards, the ADS receiver in the device arrangement will be replaced by a corresponding deviating module.

The simultaneous use of a non-cooperative sensor (earth's magnetic field sensor) and a cooperative sensor (ADS-B receiver) is a special feature in that it turns the device arrangement into a combined non-cooperative and cooperative sensor system.

The modularly integrated logic unit of the device arrangement is able to make decisions locally, for example with respect to sequencing at an intersection (this expressly also includes sequencing between air traffic and road traffic, including the automatic switching of traffic light systems or other visual systems to display traffic instructions, as well as dynamic signage), and to transmit these via unidirectional or bi-directional wired or wireless data links to the central ground situation representation and traffic guidance or traffic management system, or to optionally transmit them to the users visually or auditorily directly in the field by means of the other integrated modules or external guide means. Furthermore, the logic unit can be made use of for coordination with other device arrangements which are, in principle, of the same type, in order to make decisions locally, e.g. for an intersection, and to implement them with the aid of the integrated modules or peripheral systems.

The integrated device arrangement can communicate with further IT systems of the air-side airport infrastructure, including the Airport Operational Database or other systems via the above-mentioned data connections. Here, information can be exchanged in both directions, such as, e.g., position and vector information and captured time stamps from the integrated device arrangement to the IT systems and flight plan data or sequencing requests from the central unit to the device arrangement. The information concerning the ground situation is made available here in the ASTERIX format, for example in the CAT.10 dialect, or in a proprietary format in accordance with relevant standards. The logic unit is further responsible for synchronizing the different guide means, e.g. to switch the light to red or to deactivate it in the respective direction in case of a hold request and to send associated data link and voice instructions in parallel.

A further module for integration into the device arrangement is a device for Controller Pilot Data Link Communications (CPDLC) for transferring data link instructions, such as start-up, push-back and the taxi route to the cockpit and to vehicles. The respective instructions are made available by the central ground situation representation and traffic guidance or traffic management system with or without human intervention via the data links described and are sent on the dedicated channels according to the currently defined D-TAXI Message Set or a proprietary standard. A display of the route or of clearances such as start-up or push-back on the display system of the parking guidance system, for example an Advanced-Visual Docking Guidance System (A-VDGS), or on other display systems such as ramp displays, can also be provided.

The invention claimed is:

1. A modular device arrangement for improving the detection quality of ground situation representation systems and traffic guidance or traffic management systems for detecting moving and static objects at an airport, the modular device arrangement comprising at least the following components interacting with each other:
   a lighting unit including at least one controllable lamp,
   an earth's magnetic field sensor associated to the lighting unit, the earth's magnetic field sensor being contained in the lighting unit or arranged outside the lighting unit and physical or logically linked to the lighting unit, and
   a local control unit configured to evaluate and process data of the earth's magnetic field sensor for determining the position, direction of movement, orientation, and/or speed of the object,
   the modular device arrangement being selectively configured to be operated in the following operating modes:
   a fully autarkic operating mode, in which the data of the earth's magnetic field sensor of the modular device arrangement is evaluated and processed in the local control unit within the modular device arrangement, and wherein the local control unit is configured to operate the at least one controllable lamp based on the evaluation by the local control unit,
   a semi-autarkic operating mode, in which the data of the earth's magnetic field sensors of a combination of a plurality of modular device arrangements are evaluated and processed in a common control unit, and
   a fully integrated operating mode, in which the data of the earth's magnetic field sensors of a plurality of modular device arrangements are evaluated and processed in a central controller of an overall system for ground situation representation, traffic guidance or for traffic management or of a subsystem thereof.

2. The modular device arrangement according to claim 1, characterized in that the components of the modular device arrangement are received in a housing.

3. The modular device arrangement according to claim 1, characterized in that the earth's magnetic field sensor and/or further components of the modular device arrangement are arranged in existing or milled gaps in an aircraft movement area or as add-on parts on above-ground installations.

4. The modular device arrangement according to claim 1, characterized in that the local control unit is configured to evaluate and process data of further sensors and/or receivers of the modular device arrangement.

5. The modular device arrangement according to claim 1, characterized in that the lighting unit is a taxiway center line lighting, taxiway marker lighting, stop bar lighting or holding position lighting.

6. The modular device arrangement according to claim 1, characterized in that the modular device arrangement is configured to receive control commands via power line communication from a lighting control system, or components or peripherals thereof, which in turn is instructed by a ground situation representation and traffic guidance or traffic management system, other partner systems or by users, or via a separate communication cable, and to report back the status of the modular device arrangement via the same communication path.

7. The modular device arrangement according to claim 1, characterized by a voice module for the automated transmission of synthetic, partly synthetic or natural individual voice messages-to receivers in cockpits of commercial aircraft and vehicles at a frequency of 75 MHz.

8. The modular device arrangement according to claim 7, characterized in that the voice module is supplied with instructions by a central system for ground situation representation and for traffic guidance or traffic management, or ascertains instructions or other information locally or in combination with further identical or similar modular device arrangements.

9. The modular device arrangement according to claim 1, characterized by a modular ADS-B receiver for identification of a detected object and for receiving additional ADS-B information for the purpose of transfer to partner systems or for local use within the fully autarkic operating mode or the semi-autarkic operating mode.

10. The modular device arrangement according to claim 1, characterized by a VHF Data Link device for transmitting data link instructions, which were optionally ascertained locally according to claim 8, or which are provided by a ground situation representation and traffic guidance or traffic management system according to claim 6.

11. A system for ground situation representation, traffic guidance or traffic management at an airport, characterized in that one or a plurality of modular device arrangements according to claim 1 is or are integrated into the system, wherein the evaluation and processing of the data of the earth's magnetic field sensors of the modular device arrangements is performed in a central controller of the overall system for ground situation representation and traffic guidance or traffic management or of a subsystem thereof.

12. The modular device arrangement according to claim 1, wherein the modular device arrangement includes at least one of a wireless interconnection between a central controller and the modular device arrangement or a wireless interconnection between a plurality of modular device arrangements.

13. A method for improving the detection quality of ground situation representation systems and traffic guidance or traffic management systems, characterized in that at least one modular device arrangement according to claim 1 is used.

14. The method according to claim 13, characterized in that the position, direction of movement, orientation and/or speed of the object determined by one or more earth's magnetic field sensors are combined into a vector and output in a data format commonly used in aviation.

15. The method according to claim 13, characterized in that within the scope of the fully autarkic operating mode the data of the earth's magnetic field sensor of a modular device arrangement are evaluated and processed in the local control unit within the modular device arrangement.

16. The method according to claim 13, characterized in that within the scope of the semi-autarkic operating mode the data of the earth's magnetic field sensors of a combination of a plurality of modular device arrangements are evaluated and processed in the common control unit.

17. The method according to claim 13, characterized in that within the scope of a fully integrated operating mode the data of the earth's magnetic field sensors of a plurality of modular device arrangements are evaluated and processed in the central controller of the overall system for ground situation representation, traffic guidance or for traffic management or of a subsystem thereof.

18. The method according to claim 13, characterized in that the modular device arrangement is used for automated taxiway guidance of aircraft.

19. The method according to claim 13, characterized in that the modular device arrangement is used for automated monitoring at holding positions of aircraft, and that in the event of disregard of the holding instruction it activates systems for warning the pilots either directly or via communication with the system for ground situation representation, traffic guidance or traffic management.

20. The method according to claim 13, characterized in that the modular device arrangement is used for automated time tracking of aircraft on a parking position.

21. The method according to claim 13, characterized in that the modular device arrangement is used for automated tracking of time stamps.

22. The method according to claim 13, characterized in that the modular device arrangement is used for automated detection of an approach to an object and emits a warning of an impending collision.

23. The method according to claim 13, characterized in that the data of the earth's magnetic field sensor are transmitted via wireless or cable-bound data links in a suitable format and in a suitable manner to a system for further processing in order to integrate it in a ground situation representation of a ground situation representation and traffic guidance or traffic management system or to cause it to be displayed on a user interface (HMI).

24. The method according to claim 13, characterized in that the interactive or dynamic representation of the overall traffic situation or individual aspects thereof is transferred by the ground situation representation and traffic guidance or traffic management system to systems that are installed or held available in aircraft or vehicles, via a data link in a suitable format for the purpose of display or interaction.

25. The method according to claim 13, characterized in that information on weather or surface condition is automatically transmitted to an operator or driver of an object identified by the earth's magnetic field sensor.

26. The method according to claim 14, further comprising receiving by the modular device unit at least one of a flight plan data or a sequencing request from the central controller.

27. The method according to claim 26, further comprising regulating by the local control unit the operation of at least one guide means, based on the at least one of the flight plan data or the sequencing request.

28. The method according to claim 14, wherein the vector and output data includes a time stamp.

29. A modular device arrangement for improving the detection quality of ground situation representation systems and traffic guidance or traffic management systems for detecting moving and static objects at an airport, the modular device arrangement comprising at least the following components interacting with each other:

a lighting unit including at least one controllable lamp, an earth's magnetic field sensor associated to the lighting unit, the earth's magnetic field sensor being contained in the lighting unit or arranged outside the lighting unit and physical or logically linked to the lighting unit, and a local control unit configured to evaluate and process data of the earth's magnetic field sensor for determining the position, direction of movement, orientation, and/or speed of the object, the modular device arrangement being selectively configured to be operated in the following operating modes:

a fully autarkic operating mode, in which the data of the earth's magnetic field sensor of the modular device arrangement is evaluated and processed in the local control unit within the modular device arrangement, a semi-autarkic operating mode, in which the data of the earth's magnetic field sensors of a combination of a plurality of modular device arrangements are evaluated and processed in a common control unit, and a fully integrated operating mode, in which the data of the earth's magnetic field sensors of a plurality of modular device arrangements are evaluated and processed in a central controller of an overall system for ground situation representation, traffic guidance or for traffic management or of a subsystem thereof, wherein the modular device arrangement includes at least one of a wireless interconnection between a central controller and the modular device arrangement or a wireless interconnection between a plurality of modular device arrangements.

\* \* \* \* \*